(12) United States Patent
Kato et al.

(10) Patent No.: US 11,443,890 B2
(45) Date of Patent: Sep. 13, 2022

(54) SURFACE MOUNT COIL COMPONENT AND MANUFACTURING METHOD FOR THE SAME, AND DC-DC CONVERTER

(71) Applicant: Murata Manufacturing Co., Ltd., Nagaokakyo (JP)

(72) Inventors: Noboru Kato, Nagaokakyo (JP); Satoshi Ishino, Nagaokakyo (JP); Mitsuyoshi Nishide, Nagaokakyo (JP); Shinichiro Banba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1116 days.

(21) Appl. No.: 16/016,701

(22) Filed: Jun. 25, 2018

(65) Prior Publication Data

US 2018/0308626 A1    Oct. 25, 2018

Related U.S. Application Data

(63) Continuation of application No. PCT/JP2017/000826, filed on Jan. 12, 2017.

(30) Foreign Application Priority Data

Jan. 28, 2016  (JP) .............................. JP2016-014556

(51) Int. Cl.
*H01F 27/29*    (2006.01)
*H01F 41/10*    (2006.01)
(Continued)

(52) U.S. Cl.
CPC ........... *H01F 27/292* (2013.01); *H01F 17/04* (2013.01); *H01F 27/24* (2013.01);
(Continued)

(58) Field of Classification Search
CPC combination set(s) only.
See application file for complete search history.

(56) References Cited

U.S. PATENT DOCUMENTS 6,031,445 A * 2/2000 Marty ..................... H01L 28/10
                                                     336/200
7,281,315 B2   10/2007 Cheng
(Continued)

FOREIGN PATENT DOCUMENTS

JP    2000-036414 A    2/2000
JP    2012-526389 A   10/2012
(Continued)

OTHER PUBLICATIONS

Official Communication issued in International Patent Application No. PCT/JP2017/000826, dated Apr. 18, 2017.

*Primary Examiner* — Mang Tin Bik Lian
(74) *Attorney, Agent, or Firm* — Keating & Bennett, LLP

(57) ABSTRACT

A surface mount coil component includes an element body defining a compact including magnetic material particles; a coil that is buried, excluding an end portion of the coil, in the element body; and an input-output terminal electrically connected to the end portion of the coil. A thermoplastic resin layer is provided on a surface on a mounting surface side of the element body. An interlayer connection conductor is provided in the thermoplastic resin layer. The input-output terminal is provided on a surface of the thermoplastic resin layer and is electrically connected to the end portion of the coil via the interlayer connection conductor.

14 Claims, 7 Drawing Sheets

(51) Int. Cl.
*H01F 17/04* (2006.01)
*H01F 27/24* (2006.01)
*H01F 27/28* (2006.01)
*H01F 27/32* (2006.01)
*H01F 41/02* (2006.01)
*H01F 41/04* (2006.01)
*H02M 3/155* (2006.01)
*H05K 1/16* (2006.01)
*H05K 1/02* (2006.01)
*H02M 3/00* (2006.01)
*H05K 1/18* (2006.01)

(52) U.S. Cl.
CPC ......... *H01F 27/2823* (2013.01); *H01F 27/32* (2013.01); *H01F 41/0206* (2013.01); *H01F 41/04* (2013.01); *H01F 41/10* (2013.01); *H01F 2017/048* (2013.01); *H02M 3/00* (2013.01); *H02M 3/155* (2013.01); *H05K 1/0271* (2013.01); *H05K 1/165* (2013.01); *H05K 1/181* (2013.01); *H05K 2201/0129* (2013.01); *H05K 2201/086* (2013.01); *H05K 2201/1003* (2013.01); *H05K 2201/10015* (2013.01); *H05K 2201/10053* (2013.01)

(56) References Cited

U.S. PATENT DOCUMENTS

| | | |
|---|---|---|
| 2002/0020052 A1 | 2/2002 | Ito et al. |
| 2007/0046413 A1* | 3/2007 | Yamashita ............ H01F 17/045 336/96 |
| 2007/0063803 A1* | 3/2007 | Yamashita ............ H01F 17/045 336/83 |
| 2009/0068445 A1 | 3/2009 | Nishizawa |
| 2010/0277267 A1 | 11/2010 | Bogert et al. |
| 2012/0326827 A1 | 12/2012 | Nanjyo et al. |
| 2016/0155550 A1* | 6/2016 | Oh ............................ H01F 1/24 336/233 |
| 2016/0225517 A1* | 8/2016 | Choi ..................... H01F 27/292 |
| 2016/0322153 A1 | 11/2016 | Kawachi et al. |
| 2017/0162316 A1* | 6/2017 | Endo ..................... H01F 27/323 |
| 2017/0162317 A1* | 6/2017 | Taniguchi ............ H01F 41/046 |
| 2018/0122553 A1* | 5/2018 | Kim ..................... H01F 41/041 |
| 2019/0267182 A1* | 8/2019 | Lee ........................ H01F 17/04 |

FOREIGN PATENT DOCUMENTS

| | | |
|---|---|---|
| JP | 2013-149933 A | 8/2013 |
| JP | 2015-126201 A | 7/2015 |
| WO | 2007/148556 A1 | 12/2007 |
| WO | 2012/008171 A1 | 1/2012 |

* cited by examiner

SURFACE MOUNT COIL COMPONENT AND MANUFACTURING METHOD FOR THE SAME, AND DC-DC CONVERTER

CROSS REFERENCE TO RELATED APPLICATIONS

This application claims the benefit of priority to Japanese Patent Application No. 2016-014556 filed on Jan. 28, 2016 and is a Continuation Application of PCT Application No. PCT/JP2017/000826 filed on Jan. 12, 2017. The entire contents of each application are hereby incorporated herein by reference.

BACKGROUND OF THE INVENTION

1. Field of the Invention

The present invention relates to a surface mount coil component used for a power inductor or the like of a power supply circuit and a manufacturing method therefor, and a DC-DC converter equipped with the surface mount coil component.

2. Description of the Related Art

A known surface mount coil component is disclosed in Japanese Unexamined Patent Application Publication No. 2015-126201, for example. Japanese Unexamined Patent Application Publication No. 2015-126201 discloses a surface mount coil component having a structure in which a coil is buried, excluding an end portion of the coil, in an element body defined by a compact including magnetic material particles.

In Japanese Unexamined Patent Application Publication No. 2015-126201, the element body includes iron-based magnetic metal powder that is pressurized and molded using a binder resin. In the element body, as the volume of the magnetic material particles increases, a saturation magnetic flux density becomes higher so that the performance of the element body is improved.

However, the element body has properties as follows: as the volume of the magnetic material particles increases, a surface of the element body becomes fragile so that the magnetic material particles on the surface fall off, and unevenness (a rough portion) is likely to be generated on the surface of the element body. This raises a problem in that, at a time when a surface mount coil component is mounted on a printed circuit board, for example, a handling property of the coil component is not good.

SUMMARY OF THE INVENTION

Preferred embodiments of the present invention provide surface mount coil components capable of improving a handling property thereof and manufacturing methods therefor, and further provide DC-DC converters including the surface mount coil components.

A surface mount coil component according to a preferred embodiment of the present invention includes an element body defining a compact including magnetic material particles; a coil that is buried, excluding an end portion of the coil, in the element body; and an input-output terminal electrically connected to the end portion of the coil, wherein a thermoplastic resin layer is provided on a surface on a mounting surface side of the element body, an interlayer connection conductor is provided in the thermoplastic resin layer, and the input-output terminal is provided on a surface of the thermoplastic resin layer and is electrically connected to the end portion of the coil via the interlayer connection conductor.

A manufacturing method for a surface mount coil component according to a preferred embodiment of the present invention includes forming an element body defining a compact including magnetic material particles so as to bury a coil, excluding an end portion of the coil, in the element body; disposing, on a surface on a mounting surface side of the element body, a thermoplastic resin layer provided with an interlayer connection conductor, and causing the interlayer connection conductor and the end portion of the coil to make contact with each other; and softening the thermoplastic resin layer by heating and then bonding the thermoplastic resin layer to the element body, and bonding the interlayer connection conductor to the end portion of the coil.

A DC-DC converter according to a preferred embodiment of the present invention includes a switching element and a choke coil connected to the switching element, wherein the choke coil includes an element body defining a compact including magnetic material particles; a coil that is buried, excluding an end portion of the coil, in the element body; and an input-output terminal electrically connected to the end portion of the coil, a thermoplastic resin layer is provided on a surface on a mounting surface side of the element body, an interlayer connection conductor is provided in the thermoplastic resin layer, and the input-output terminal is provided on a surface of the thermoplastic resin layer and is electrically connected to the end portion of the coil via the interlayer connection conductor.

According to preferred embodiments of the present invention, a handling property of surface mount coil components is improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
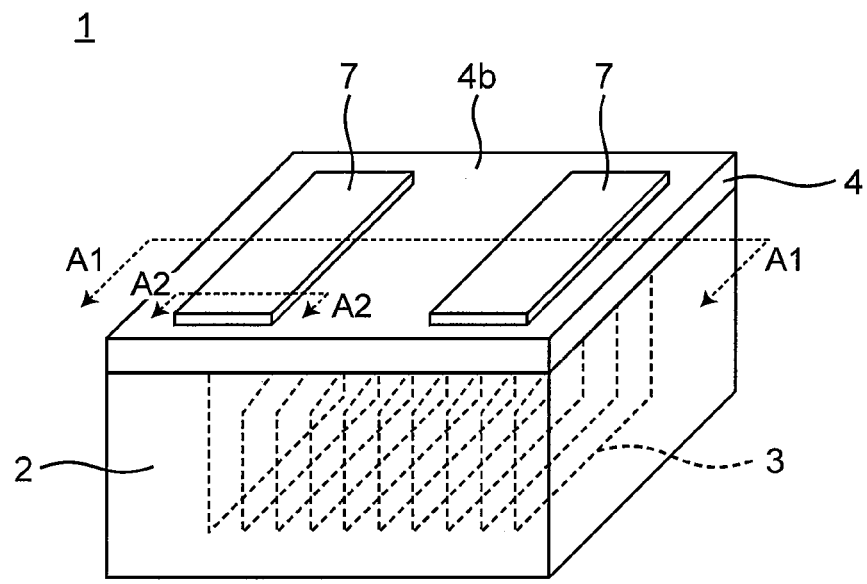
FIG. 1 is a perspective view of a surface mount coil component according to a preferred embodiment of the present invention.

A surface mount coil component according to a preferred embodiment of the present invention includes an element body defining a compact including magnetic material particles; a coil that is buried, excluding an end portion of the coil, in the element body; and an input-output terminal electrically connected to the end portion of the coil, wherein a thermoplastic resin layer is provided on a surface on a mounting surface side of the element body, an interlayer connection conductor is provided in the thermoplastic resin layer, and the input-output terminal is provided on a surface of the thermoplastic resin layer and is electrically connected to the end portion of the coil via the interlayer connection conductor.

According to this configuration, since the thermoplastic resin layer is provided on the surface on the mounting surface side of the element body defined by a compact including magnetic material particles, the surface is not exposed. This makes it possible to improve a handling property of the surface mount coil component. A surface layer region of the thermoplastic resin layer is softened at a contact surface with the element body by heating, and is able to enter into and make close contact with an uneven portion of the surface of the element body (in other words, an anchor effect is able to be obtained). This makes it possible to improve the strength of bonding between the thermoplastic resin layer and the element body. Further, the input-output terminal is provided on the surface of the thermoplastic resin layer and is electrically connected to the end portion of the coil via the interlayer connection conductor provided in the thermoplastic resin layer. This makes it possible to prevent peeling, falling, and other defects of the input-output terminal, and to secure the conduction between the input-output terminal and the end portion of the coil.

It is preferable that the magnetic material particles are magnetic metal powder and the element body is a pressurized powder compact including the magnetic metal powder, for example. The pressurized powder compact is a compact in which magnetic metal powder is pressurized and molded using a binding material, such as resin, and which is able to increase the content of the magnetic metal powder in the element body. Because of this, magnetic saturation is unlikely to occur so that a coil component having excellent direct-current superposition characteristics is obtained. The pressurized powder compact may not contain resin.

It is preferable that a plating film is provided on a surface of the input-output terminal. The thermoplastic resin layer is provided on the surface of the element body defined by the compact including the magnetic material particles. Due to this, abnormal precipitation is unlikely to be generated at the time of plating processing, which enables a surface mount coil component with excellent reliability to be obtained.

It is preferable that a width of a wire defining the coil is smaller than a width of the interlayer connection conductor, and that the end portion of the coil projects from the surface of the element body and is positioned inside the connection conductor. With this configuration, a contact area between the interlayer connection conductor and the end portion of the coil is increased, so that the strength of bonding between the interlayer connection conductor and the end portion of the coil is improved. That is, a wire-wound coil, which is preferably made by winding a metal wire in a coil shape, is able to be used as the coil.

It is preferable that an intermetallic compound is formed in a bonding portion between the interlayer connection conductor and the end portion of the coil. With this configuration, the strength of bonding between the interlayer connection conductor and the end portion of the coil is further improved.

It is preferable that a thermoplastic resin layer is also provided on a rear surface of the element body. According to this configuration, the thermoplastic resin layers are provided on both surfaces, that is, the surface and the rear surface of the element body, which makes it possible to reduce warpage and deformation of the surface mount coil component. By making the materials of the thermoplastic resin layers on the surface and the rear surface of the element body be the same, the element body is sandwiched between the thermoplastic resin layers having the same thermal expansion coefficient, which makes it possible to further reduce a warp and a deformation of the surface mount coil component.

A manufacturing method for a surface mount coil component according to a preferred embodiment of the present invention includes forming an element body defining a compact including magnetic material particles so as to bury a coil, excluding an end portion of the coil, in the element body; disposing, on a surface on a mounting surface side of the element body, a thermoplastic resin layer provided with an interlayer connection conductor, and causing the interlayer connection conductor and the end portion of the coil to make contact with each other, and softening the thermoplastic resin layer by heating and then bonding the thermoplastic resin layer to the element body, and bonding the interlayer connection conductor to the end portion of the coil.

According to this manufacturing method, since the thermoplastic resin layer is disposed on the surface on the mounting surface side of the element body defined by a compact including magnetic material particles, the surface is not exposed. This makes it possible to improve the handling property of the surface mount coil component. Further, a surface layer region of the thermoplastic resin layer is softened at a contact surface with the element body by heating, and is able to enter into and make close contact with an uneven portion of the surface of the element body. This makes it possible to improve the strength of bonding between the thermoplastic resin layer and the element body.

It is preferable that a width of a wire defining the coil is smaller than a width of the interlayer connection conductor, and that the element body is formed so that the end portion of the coil projects from the surface of the element body. According to this manufacturing method, a contact area between the interlayer connection conductor and the end portion of the coil is increased, so that the strength of bonding between the interlayer connection conductor and the end portion of the coil is improved.

It is preferable that the interlayer connection conductor is provided in a non-metalized state in a hole formed in the thermoplastic resin layer, is made to be in contact with the end portion of the coil in the non-metalized state, is changed from the non-metalized state to a metalized state by the heating, and is bonded to the end portion of the coil. According to this manufacturing method, the interlayer connection conductor in the non-metalized state is changed to the metalized state by heating, and then the connection conductor in the metalized state is bonded to the end portion of the coil, thus making it possible to improve the strength of bonding between the interlayer connection conductor and the end portion of the coil. In addition, since the interlayer connection conductor in the non-metalized state is changed to the metalized state by heating the thermoplastic resin layer, the bonding between the thermoplastic resin layer and the element body, and the bonding between the interlayer connection conductor and the end portion of the coil are able to be performed at the same time. This makes it possible to reduce the manufacturing time.

It is preferable that, when the interlayer connection conductor in the metalized state is bonded to the end portion of the coil by heating, the heating be performed under pressure so that an intermetallic compound is formed in a bonding portion between the interlayer connection conductor in the metalized state and the end portion of the coil. According to this manufacturing method, the interlayer connection conductor and the end portion of the coil are bonded to each other not only by merely a physical contact, but also bonded to each other with the intermetallic compound interposed therebetween, thus the strength of bonding between the interlayer connection conductor and the end portion of the coil is able to be further improved.

A DC-DC converter according to a preferred embodiment of the present invention includes a switching element and a choke coil connected to the switching element, wherein the choke coil includes an element body defining a compact including magnetic material particles; a coil that is buried, excluding an end portion of the coil, in the element body; and an input-output terminal electrically connected to the end portion of the coil, a thermoplastic resin layer is provided on a surface on a mounting surface side of the element body, an interlayer connection conductor is provided in the thermoplastic resin layer, and the input-output terminal is provided on a surface of the thermoplastic resin layer and is electrically connected to the end portion of the coil via the interlayer connection conductor.

According to this configuration, since the thermoplastic resin layer is provided on the surface on the mounting surface side of the element body defined by a compact including magnetic material particles, the surface is not exposed. This makes it possible to improve a handling property of the choke coil. Further, the thermoplastic resin layer is softened by heating, and is able to enter into and make close contact with an uneven portion of the surface of the element body. This makes it possible to improve the strength of bonding between the thermoplastic resin layer and the element body. Furthermore, the input-output terminal is electrically connected to the end portion of the coil via the interlayer connection conductor provided in the thermoplastic resin layer, which makes it possible to secure the conduction between the input-output terminal and the end portion of the coil.

Hereinafter, a preferred embodiment of the present invention will be described with reference to the drawings.

Figure 2:
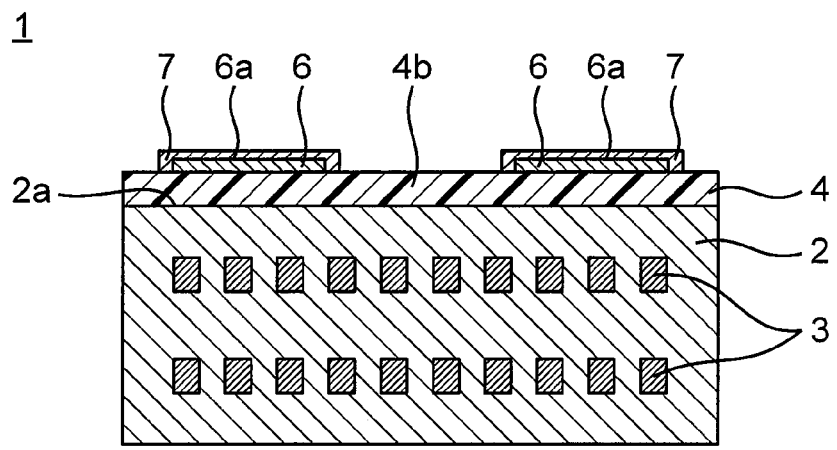
FIG. 2 is a cross-sectional view taken along an A1-A1 line in FIG. 1.
Figure 3:
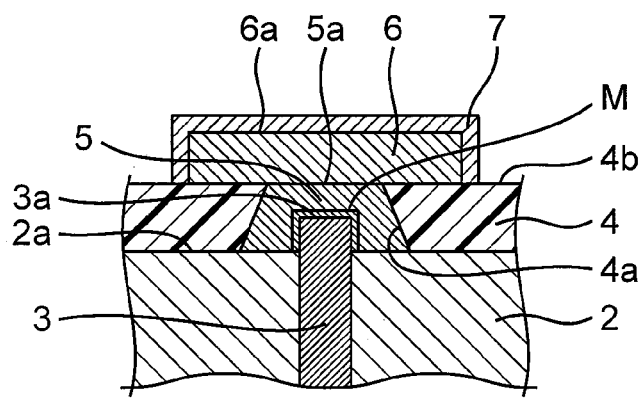
FIG. 3 is a cross-sectional view taken along an A2-A2 line in FIG. 1.

First, an example of a surface mount coil component 1 according to a preferred embodiment will be described with reference to FIGS. 1 to 3. FIG. 1 is a perspective view of the surface mount coil component according to the present preferred embodiment of the present invention. FIG. 2 is a cross-sectional view taken along an A1-A1 line in FIG. 1. FIG. 3 is a cross-sectional view taken along an A2-A2 line in FIG. 1.

As illustrated in FIG. 1 or FIG. 2, the surface mount coil component 1 according to the present preferred embodiment includes an element body 2 and a coil 3 buried in the element body 2.

The element body 2 is a compact including magnetic material particles. For example, the element body 2 preferably includes magnetic material particles in a volume percentage of no less than about 85%, and more preferably no less than about 95%. The element body 2 preferably includes iron-based magnetic metal powder that is pressurized and molded using a thermosetting binder resin (e.g., epoxy resin), for example. The magnetic material particles of iron-based magnetic metal powder may preferably be magnetic material particles in which manganese or chromium is added as an addition agent to iron, for example. The element body 2 may be a compact that is molded as follows: that is, without including a binder resin, an oxide film is provided as an insulator on a surface of each of the magnetic material particles, and molding is performed so that pieces of crystal defining the oxide film are connected to one another. The element body 2 preferably has, for example, a rectangular or substantially rectangular parallelepiped shape.

The coil 3 is preferably, for example, an air-core type wire-wound coil defined by winding a copper-based wire or other suitable wire in a rectangular or substantially rectangular shape in a side view. A cross-sectional shape of the wire is preferably, for example, rectangular or substantially rectangular (including square), circular or substantially circular, or other suitable shape. An insulation coating may be provided on a surface of the wire defining the coil 3.

A thermoplastic resin layer 4 is provided on a surface 2a on a mounting surface side of the element body 2. The thermoplastic resin layer 4 is preferably a sheet of polyimide, liquid crystal polymer, or other suitable thermoplastic resin, for example.

In the thermoplastic resin layer 4, as illustrated in FIG. 3, a through-hole 4a extends through the thermoplastic resin layer 4 in a thickness direction thereof. The through-hole 4a preferably has a truncated cone shape or a truncated pyramid shape, for example. In other words, the through-hole 4a is tapered such that the width thereof is larger at a position closer to the surface of the element body 2.

In the through-hole 4a of the thermoplastic resin layer 4, a connection electrode 5 is provided and defines an interlayer connection conductor to connect a front layer and a rear layer of the thermoplastic resin layer 4. The connection conductor 5 fills the through-hole 4a and seals the through-hole 4a without any space, for example. The connection conductor 5 is preferably made of a material that is changed, by heating, from a non-metalized state to a metalized state, and is capable of forming an intermetallic compound M between an end portion 3a of the coil 3 and the connection conductor 5. For example, it is known that copper and tin form an intermetallic compound therebetween by heating under pressure. Because of this, for example, when the coil 3 is defined by a copper-based wire, it is preferable that the connection conductor 5 is made of a material including tin-based metal powder.

In the present preferred embodiment, as illustrated in FIG. 3, the end portion 3a of the coil 3 projects from the surface 2a of the element body 2 and is positioned inside the connection conductor 5. A width of the wire defining the coil 3 is preferably smaller than a width of the through-hole 4a so that the overall end portion 3a of the coil 3 is positioned within the through-hole 4a. Here, the "width of the wire" refers to a length of a long side in a case in which a cross-sectional shape of the wire is rectangular or substantially rectangular, or refers to a diameter in a case in which the cross-sectional shape of the wire is circular or substantially circular, for example. Further, the "width of the through-hole 4a" (in other words, the "width of the interlayer connection conductor") refers to a minimum diameter in a case in which the through-hole 4a has a truncated cone shape, or refers to a length of a minimum short side in a case in which the through-hole 4a has a truncated pyramid shape, for example.

An input-output terminal 6 having a land shape is provided on a surface 4b of the thermoplastic resin layer 4 and covers a surface 5a of the connection conductor 5. The input-output terminal 6 is preferably made of, for example, a metal thin film such as copper foil. The input-output terminal 6 is electrically connected to the end portion 3a of the coil 3 via the connection conductor 5. Two input-output terminals 6 are provided in one surface mount coil component 1. After being mounted on a printed circuit board or other substrate, one of the input-output terminals 6 defines and functions as an input terminal, while the other one of the input-output terminals 6 defines and functions as an output terminal. The one of the input-output terminals 6 is electrically connected to one end portion 3a of the coil 3 via the connection conductor 5. The other one of the input-output terminals 6 is electrically connected to another end portion 3a of the coil 3 via the connection conductor 5.

A plating film 7 is provided on the input-output terminal 6 and covers an exposure surface 6a of the input-output terminal 6. The plating film 7 is preferably made of, for example, a metal material such as nickel or gold.

According to the present preferred embodiment, the thermoplastic resin layer 4 is provided on the surface 2a of the element body 2 defined by a compact including the magnetic material particles, so that the surface 2a on the mounting surface side of the element body 2 is not exposed, thus making it possible to improve a handling property of the surface mount coil component 1. To be specific, for example, the falling-off of the magnetic material particles is reduced or prevented, and a pickup handling property is improved.

According to the present preferred embodiment, the thermoplastic resin layer 4 is softened by heating, and is able to enter into and make close contact with an uneven portion of the surface 2a of the element body 2, which makes it possible to improve the strength of bonding between the thermoplastic resin layer 4 and the element body 2.

According to the present preferred embodiment, the input-output terminal 6 is electrically connected to the end portion 3a of the coil 3 via the connection conductor 5 provided in the through-hole 4a of the thermoplastic resin layer 4, which makes it possible to secure the conduction between the input-output terminal 6 and the end portion 3a of the coil 3.

According to the present preferred embodiment, the width of the wire defining the coil 3 is smaller than the width of the through-hole 4a, and the end portion 3a of the coil 3 projects from the surface 2a of the element body 2 and is positioned inside the connection conductor 5. With this configuration, a contact area between the connection conductor 5 and the end portion 3a of the coil 3 is increased, so that the strength of bonding between the connection conductor 5 and the end portion 3a of the coil 3 is improved.

According to the present preferred embodiment, the intermetallic compound M is formed in the bonding portion between the connection conductor 5 and the end portion 3a of the coil 3. With this configuration, the strength of bonding between the connection conductor 5 and the end portion 3a of the coil 3 is further improved.

Further, according to the present preferred embodiment, the input-output terminal 6 is provided on the thermoplastic resin layer 4, not on the element body 2. A thermoplastic resin forming the thermoplastic resin layer 4 generally has higher plating resistance than the element body 2. Accordingly, the plating film is able to be easily formed on the input-output terminal 6 without any trouble.

Furthermore, according to the present preferred embodiment, the thermoplastic resin layer 4, which is preferably a non-magnetic material or has lower magnetic permeability than the element body 2, for example, is interposed between the element body 2 and the input-output terminal 6. With this configuration, a closed magnetic circuit is provided inside the element body 2, such that an eddy current due to magnetic flux colliding against the input-output terminal 6 is unlikely to be generated. This makes it possible to reduce or prevent the degradation of a Q-value of the coil 3.

Next, an example of a manufacturing method for the surface mount coil component 1 according to a preferred embodiment of the present invention will be described with reference to FIGS. 4 to 9.

Figure 4:
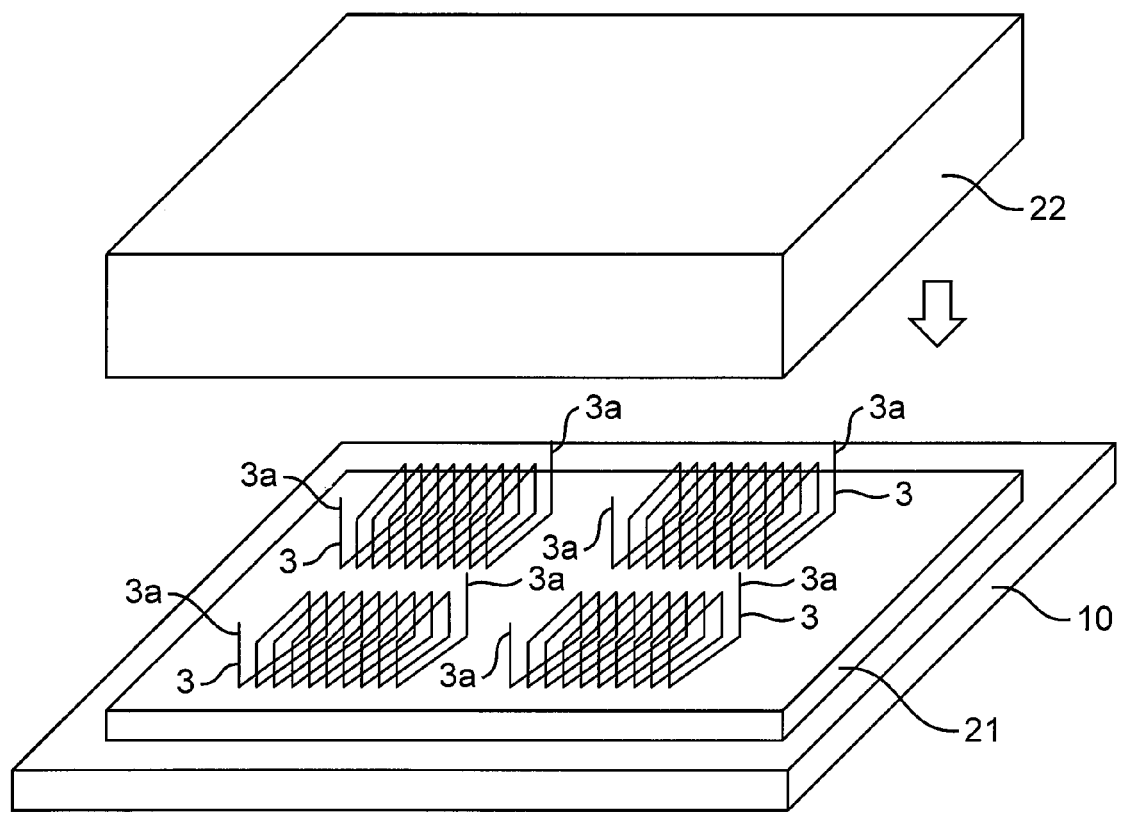
FIG. 4 is a perspective view illustrating a process in a manufacturing method for the surface mount coil component illustrated in FIG. 1.
Figure 5:
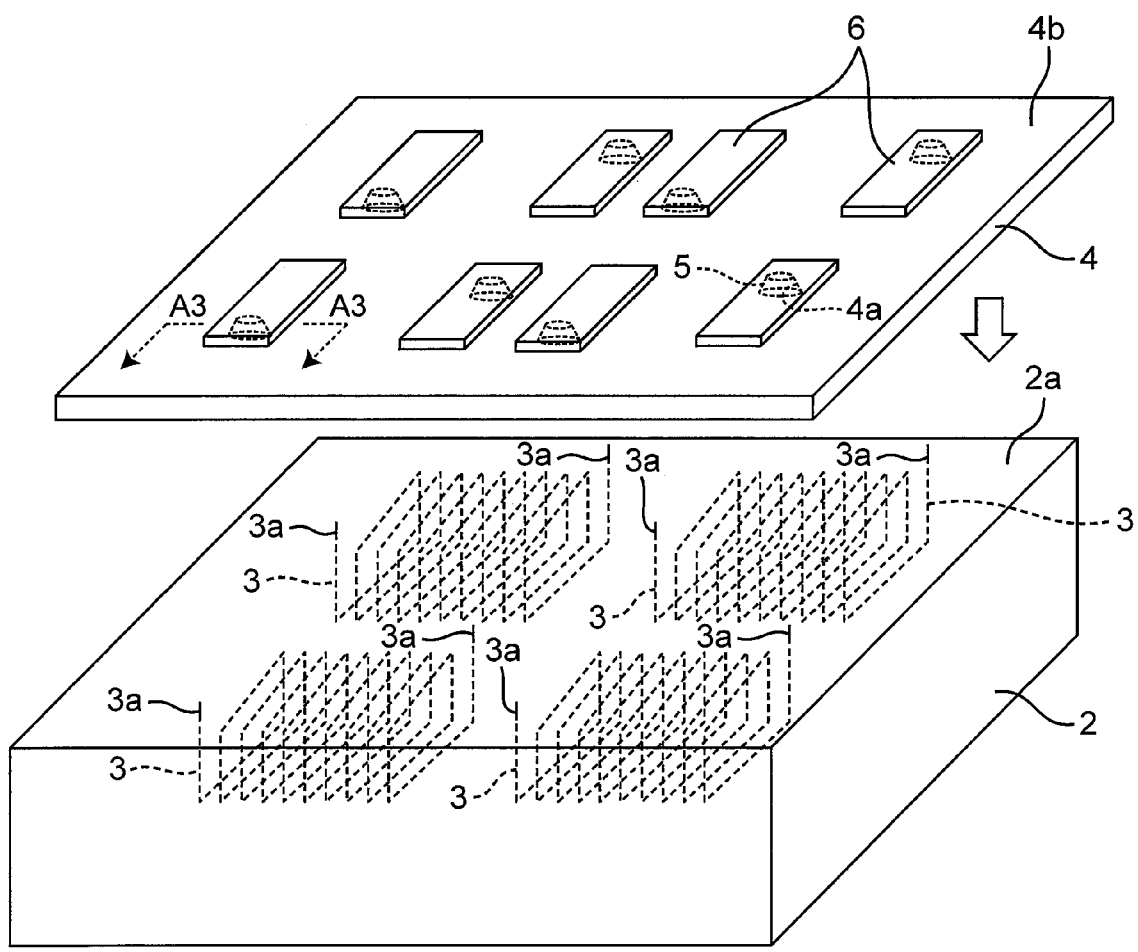
FIG. 5 is a perspective view illustrating a process following the process in FIG. 4.
Figure 6:
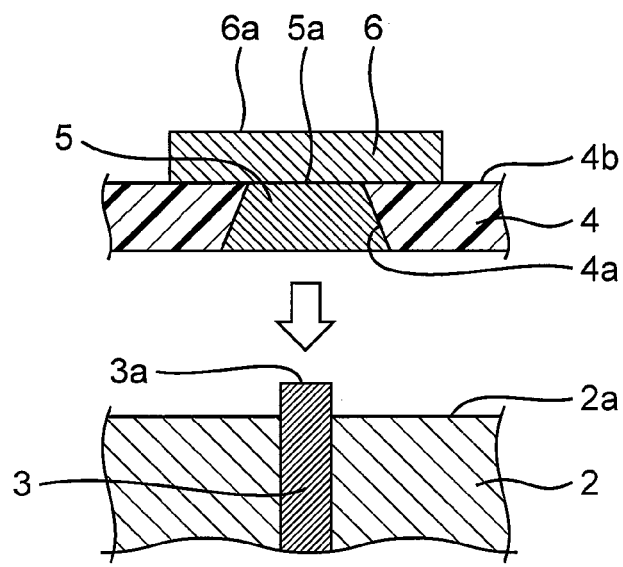
FIG. 6 is a cross-sectional view taken along an A3-A3 line in FIG. 5.
Figure 7:
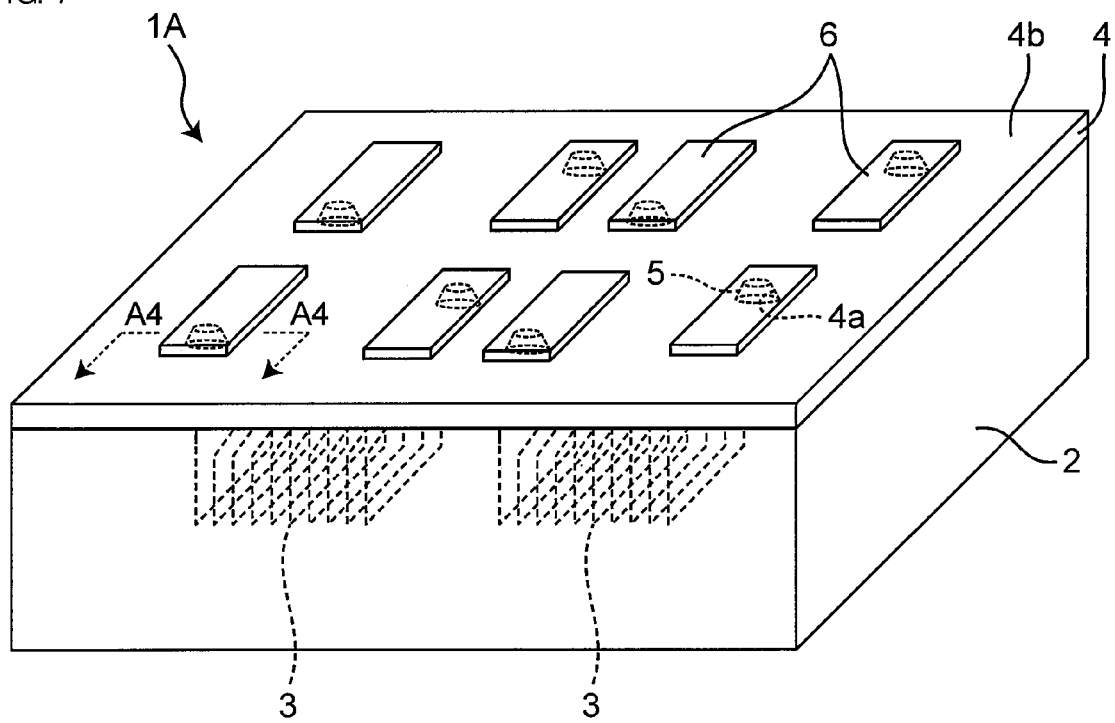
FIG. 7 is a perspective view illustrating a process following the process in FIG. 5.
Figure 8:
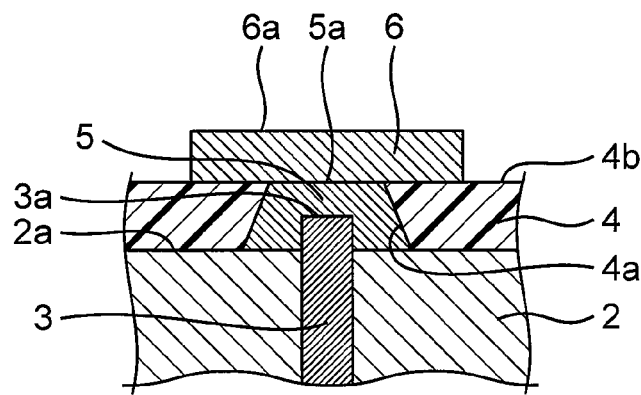
FIG. 8 is a cross-sectional view taken along an A4-A4 line in FIG. 7.
Figure 9:
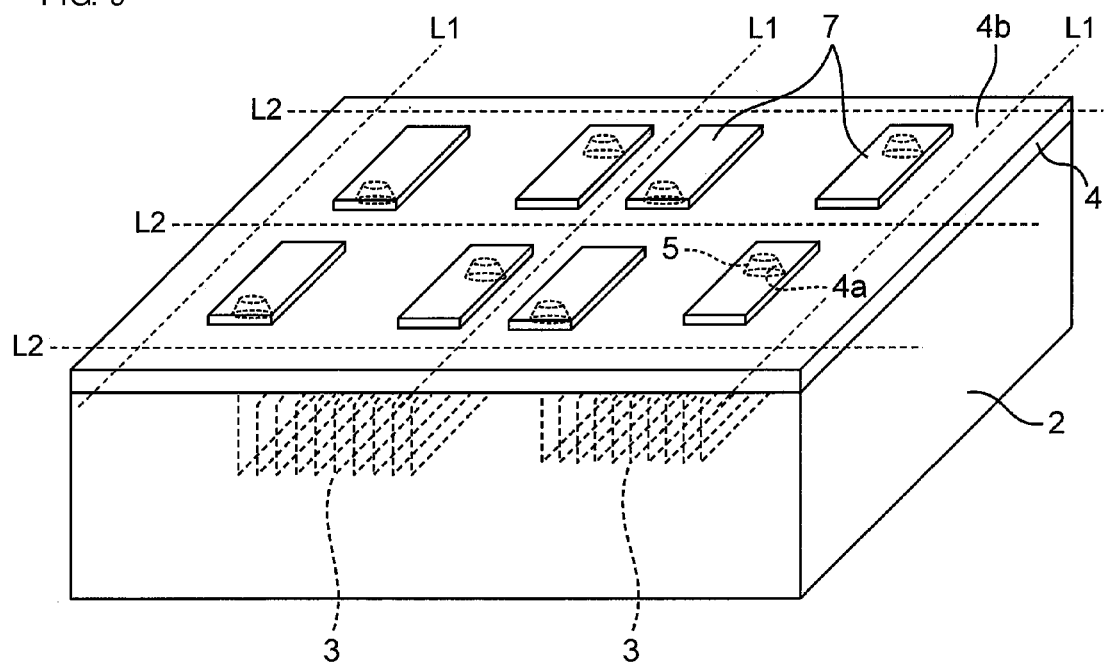
FIG. 9 is a perspective view illustrating a process following the process in FIG. 7.

FIG. 4 is a perspective view illustrating a process in the manufacturing method for the surface mount coil component 1. FIG. 5 is a perspective view illustrating a process following the process in FIG. 4. FIG. 6 is a cross-sectional view taken along an A3-A3 line in FIG. 5. FIG. 7 is a perspective view illustrating a process following the process in FIG. 5. FIG. 8 is a cross-sectional view taken along an A4-A4 line in FIG. 7. FIG. 9 is a perspective view illustrating a process following the process in FIG. 7.

First, as illustrated in FIG. 4, an element body 21 in a semi-cured state is disposed on a support platform 10, and a plurality of coils 3 are disposed on the element body 21. At this time, the plurality of coils 3 are disposed in a matrix, for example. Each of the coils 3 is disposed such that both end portions 3a, 3a thereof are positioned above the main body of the coil 3. The "semi-cured state" refers to, for example, a state in which the element body 21 is cured in advance (has experienced pressurized powder molding) so as to have sufficient hardness such that the shape of the element body 21 is maintained.

Next, an element body 22 in an uncured state is formed on the element body 21 in the semi-cured state and covers the plurality of coils 3. Thereafter, the element body 21 in the semi-cured state and the element body 21 in the uncured state are cured (experience pressurized powder molding) and integrated. The "uncured state" refers to a state in which the element body 21 has low viscosity so as to fill not only the periphery of each of the coils 3 but also the interior of each of the coils 3. Here, the element body 21 in the semi-cured state previously molded in a sheet shape or a block shape and the element body 22 in the uncured state are used. However, the plurality of coils 3 may be disposed in a mold for pressurized powder molding, and then magnetic metal powder may be injected thereinto in a powder state to be molded under a predetermined temperature and a predetermined pressure.

Next, a surface layer portion on a mounting surface side of the element body 22 is polished, so that the end portions 3a of the coils 3 are exposed and project from the surface 2a of the element body 2 as illustrated in FIGS. 5 and 6. With this method, the element body 2 in which the plurality of coils 3 are buried is formed. The polishing of the surface layer portion on the mounting surface side of the element body 22 may be performed by sandblasting, for example.

Next, as illustrated in FIGS. 7 and 8, the thermoplastic resin layer 4 including the through-hole 4a in which the connection conductor 5 in a non-metalized state is provided is disposed on the surface 2a of the element body 2, and the connection conductor 5 in the non-metalized state and the end portion 3a of the coil 3 are disposed in contact with each other. At this time, since the through-hole 4a is tapered such that the width thereof is larger at a position closer to the surface of the element body 2, the positioning of the connection conductor 5 in the non-metalized state and the end portion 3a of the coil 3 is able to be performed with ease such that they make contact with each other. The input-output terminal 6 is provided beforehand on the surface 4b of the thermoplastic resin layer 4 and covers the surface 5a of the connection conductor 5. After the input-output terminal 6 is provided on the surface 4b of the thermoplastic resin layer 4 and covers the through-hole 4a, the connection conductor 5 is formed by the interior of the through-hole 4a being filled with a conductive paste, for example.

Next, the thermoplastic resin layer 4 is softened by heating so that the thermoplastic resin layer 4 and the element body 2 are bonded to each other, and the connection conductor 5 in the non-metalized state is changed to the metalized state by the heating so that the connection conductor 5 in the metalized state and the end portion 3a of the coil 3 are bonded to each other. At this time, the heating is preferably performed under pressure so that the intermetallic compound M is formed in the bonding portion between the connection conductor 5 in the metalized state and the end portion 3a of the coil 3.

Next, as illustrated in FIGS. 2 and 3, the plating film is formed and covers the exposure surface 6a of each of the input-output terminals 6.

Subsequently, the element body 2 and the thermoplastic resin layer 4 are cut along a plurality of dotted cutting lines L1 and L2 as illustrated in FIG. 9, positioned between the coils 3 and 3 adjacent to each other, in the thickness direction. In this manner, singulation by which individual surface mount coil components 1 (see FIG. 1) are produced is performed.

According to the present preferred embodiment, the thermoplastic resin layer 4 is formed on the surface 2a of the element body 2 defined by a compact including the magnetic material particles, so that the surface 2a on the mounting surface side of the element body 2 is not exposed, thus making it possible to improve the handling property of the surface mount coil component 1.

According to the present preferred embodiment, the thermoplastic resin layer 4 is softened by heating, and is able to enter into and make close contact with an uneven portion of the surface 2a of the element body 2. This makes it possible to improve the strength of bonding between the thermoplastic resin layer 4 and the element body 2.

According to the present preferred embodiment, the connection conductor 5 in the non-metalized state changed to the metalized state by heating, and then the connection conductor 5 in the metalized state is bonded to the end portion 3a of the coil 3, thus making it possible to improve the strength of bonding between the connection conductor 5 and the end portion 3a of the coil 3.

According to the present preferred embodiment, the input-output terminal 6 and the end portion 3a of the coil 3 are electrically connected to each other via the connection conductor 5 provided in the through-hole 4a of the thermoplastic resin layer 4, which makes it possible to secure the conduction between the input-output terminal 6 and the end portion 3a of the coil 3.

In addition, according to the present preferred embodiment, since the conductive paste used for the connection conductor 5 in the non-metalized state is changed to the metalized state by heating of the thermoplastic resin layer 4, the bonding between the thermoplastic resin layer 4 and the element body 2, and the bonding between the connection conductor 5 and the end portion 3a of the coil 3 are able to be performed at the same time. This makes it possible to reduce the time for manufacturing the surface mount coil component 1.

According to the present preferred embodiment, the width of the wire defining the coil 3 is preferably smaller than the width of the through-hole 4a, and the element body 2 is formed such that the end portion 3a of the coil 3 projects from the surface 2a of the element body 2. With this configuration, a contact area between the connection conductor 5 and the end portion 3a of the coil 3 is increased, so that the strength of bonding between the connection conductor 5 and the end portion 3a of the coil 3 is improved.

Further, according to the present preferred embodiment, when the connection conductor 5 in the metalized state is bonded by heating, to the end portion 3a of the coil 3, the heating is performed under pressure so that the intermetallic compound M is formed in the bonding portion between the connection conductor 5 in the metalized state and the end portion 3a of the coil 3. With this method, the strength of bonding between the connection conductor 5 and the end portion 3a of the coil 3 is further improved. For example, in a case in which a conductor defining the coil 3 includes Cu and a conductive paste used for the connection conductor 5 includes Sn, the intermetallic compound M such as $Cu_6Sn_5$, for example, is preferably generated by heating at an interface between the connection conductor 5 and the end portion of the coil 3.

Furthermore, according to the present preferred embodiment, the thermoplastic resin layer 4 is formed on the surface 2a of the element body 2, which makes it possible to form the plating film 7 with ease. Because the plating film 7 is unlikely to adhere to the surface 4b of the thermoplastic resin layer 4, the plating film 7 is able to be formed on the exposure surface 6a of the input-output terminal 6 by forming the plating film 7 on the overall surface 4b of the thermoplastic resin layer 4 without considering the position of the input-output terminal 6.

The plating film 7 may also be formed by immersing a block 1A, illustrated in FIG. 7, completely in a plating liquid and thereafter drying it, for example. In this case, although the plating also adheres to a side surface and a rear surface of the block 1A (abnormal precipitation occurs), the plating adhered to a side surface of the surface mount coil component 1 is able to be removed by cutting the block 1A along the plurality of cutting lines L1 and L2 indicated by dotted lines in FIG. 9. The plating adhered to the rear surface of the block 1A may be removed by polishing or other suitable method, or may not be removed in a case in which the electric characteristics of the surface mount coil component 1 are not largely affected by the adhered plating.

Figure 10:
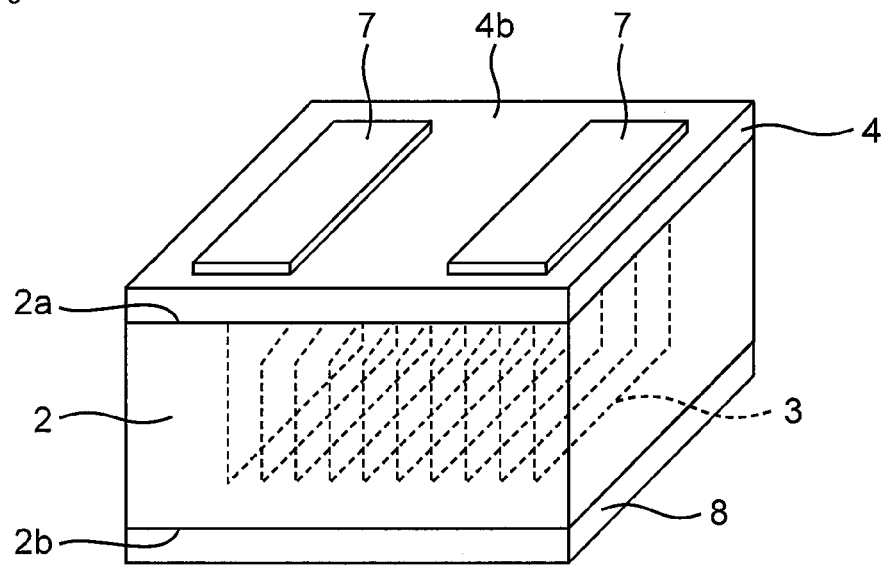
FIG. 10 is a perspective view illustrating a variation on the surface mount coil component illustrated in FIG. 1.

As illustrated in FIG. 10, a thermoplastic resin layer 8 may preferably be provided on a rear surface 2b of the element body 2. In this case, by forming the thermoplastic resin layer 8 before forming the plating film 7, the adhesion of the plating to a rear surface of the surface mount coil component 1 is able to be reduced or prevented. Moreover, in this case, the thermoplastic resin layers 4 and 8 are provided on both the surfaces of the element body 2, that is, the surface 2a and the rear surface 2b respectively, so that the element body 2 is sandwiched between the thermoplastic resin layers 4 and 8 having the same thermal expansion coefficient. This makes it possible to reduce warpage and deformation of the surface mount coil component 1. As a result, the reliability of the surface mount coil component 1 is able to be improved.

As the volume of the magnetic material particles in the element body 2 is increased, the plating is more likely to adhere to the surface, the side surface, and the rear surface of the element body 2. In the case in which the plating adheres to any one of the surface, the side surface, and the rear surface of the element body 2, the characteristics of the coil 3 (e.g., Q-value) are degraded. In addition, a short circuit may be caused between the input-output terminals 6 and 6 adjacent to each other.

Next, an example of a DC-DC converter 50 including a surface mount coil component 1 according to a preferred embodiment of the present invention will be described with reference to FIGS. 11 and 12.

Figure 11:
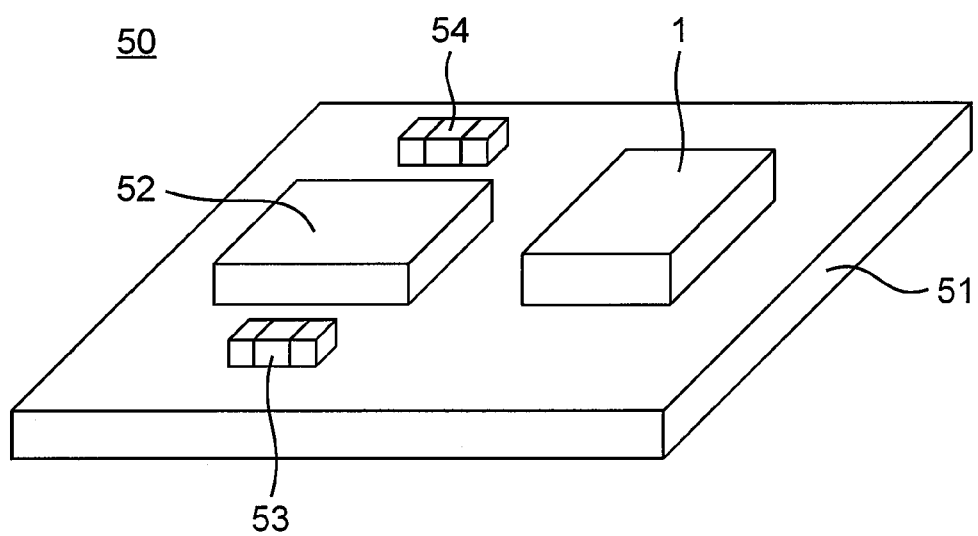
FIG. 11 is a perspective view of a DC-DC converter according to a preferred embodiment of the present invention including the surface mount coil component illustrated in FIG. 1.

FIG. 11 is a perspective view of the DC-DC converter 50 including the surface mount coil component 1. FIG. 12 is a circuit diagram of the DC-DC converter 50 illustrated in FIG. 11.

The DC-DC converter 50 is preferably a step-up/step-down DC-DC converter, for example. As illustrated in FIG. 11, the DC-DC converter 50 includes a switching element 52, the surface mount coil component 1 defining a choke coil, an input capacitor 53, and an output capacitor 54 are mounted on a printed circuit board 51.

Figure 12:
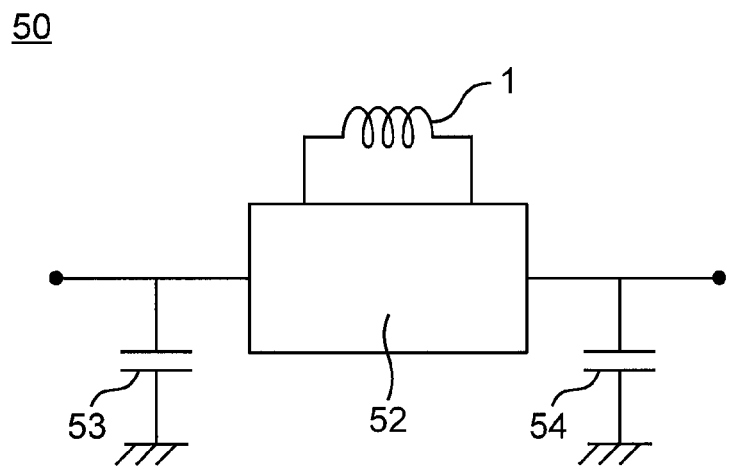
FIG. 12 is a circuit diagram of the DC-DC converter illustrated in FIG. 11.

The surface mount coil component 1 is connected to the switching element 52 as illustrated in FIG. 12. One end of the input capacitor 53 is connected to an input terminal of the switching element 52. The other end of the input capacitor 53 is grounded. One end of the output capacitor 54 is connected to an output terminal of the switching element 52. The other end of the output capacitor 54 is grounded.

According to this configuration, since the DC-DC converter 50 includes the surface mount coil component 1, performance, such as direct-current superposition characteristics, of the DC-DC converter 50 is improved, thus making it possible to provide a large current compatible DC-DC converter.

It is to be noted that the present invention is not limited to the preferred embodiments described above, and may be embodied in various other aspects. For example, although the end portion 3a of the coil 3 is exposed and projects from the surface 2a of the element body 2 by polishing the surface 2a of the element body 2 as described above, the present invention is not limited thereto. For example, at the time of forming the element body 22, the element body 22 may be formed such that the end portion 3a of the coil 3 projects from the surface 2a of the element body 2.

Further, it is not absolutely necessary for the end portion 3a of the coil 3 to project from the surface 2a of the element body 2, and it is sufficient for the end portion to be exposed from the surface 2a of the element body 2. For example, the end portion 3a of the coil 3 may be exposed from the surface 2a of the element body 2 by polishing the surface layer portion on the mounting surface side of the element body 22 with a diamond scriber, buffer, or other suitable device.

In the preferred embodiments described above, the input-output terminal 6 is formed in advance on the surface 4b of the thermoplastic resin layer 4, and thereafter the thermoplastic resin layer 4 is formed on the surface 2a of the element body 2. However, the present invention is not limited thereto. For example, the thermoplastic resin layer 4 may be formed on the surface 2a of the element body 2, and thereafter the input-output terminal 6 may be formed on the surface 4b of the thermoplastic resin layer 4.

Further, in the preferred embodiments described above, the through-hole 4a extends thorough the thermoplastic resin layer 4 in the thickness direction thereof, and the connection conductor 5 defining an interlayer connection conductor is provided in the through-hole 4a. However, the present invention is not limited thereto. For example, the thermoplastic resin layer 4 may have a laminated structure in which a plurality of thermoplastic resin layers are laminated, and it is sufficient for the interlayer connection conductor to connect a front layer and a rear layer of the thermoplastic resin layer in the laminated structure. For example, the following configuration may preferably be provided: through-holes are provided in the plurality of thermoplastic resin layers at different positions in the thickness direction thereof, the through-holes are filled with connection conductors, and the connection conductors are each electrically connected by wiring or other connection structure. In this case, the connection conductors and the wiring each correspond to the interlayer connection conductors.

Although the present invention is sufficiently described with reference to the above-described preferred embodiments and the accompanying drawings, and it is apparent to those skilled in the art that various variations and modifications can be performed. Such variations and modifications are included in the scope of the present invention without departing from the scope of the present invention as set forth in the claims.

According to preferred embodiments of the present invention, a handling property of a surface mount coil component is improved. As such, preferred embodiments of the present invention are useful for a choke coil used in a DC-DC converter, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface mount coil component comprising:
   an element body defining a compact including magnetic material particles;
   a coil that is buried, excluding an end portion of the coil, in the element body; and
   an input-output terminal electrically connected to the end portion of the coil; wherein
   a thermoplastic resin layer is provided on a surface on a mounting surface side of the element body;
   an interlayer connection conductor is provided in the thermoplastic resin layer;
   the input-output terminal is provided on a surface of the thermoplastic resin layer and is electrically connected to the end portion of the coil via the interlayer connection conductor;
   the end portion of the coil projects from the surface of the element body and is positioned inside the interlayer connection conductor; and
   a width of a wire defining the end portion of the coil is smaller than a width of the interlayer connection conductor.

2. The surface mount coil component according to claim 1, wherein the magnetic material particles are magnetic metal powder, and the element body is a pressurized powder compact including the magnetic metal powder.

3. The surface mount coil component according to claim 1, wherein a plating film is provided on a surface of the input-output terminal.

4. The surface mount coil component according to claim 1, wherein an intermetallic compound is included in a bonding portion between the interlayer connection conductor and the end portion of the coil.

5. The surface mount coil component according to claim 1, wherein a thermoplastic resin layer is provided on a rear surface of the element body.

6. The surface mount coil component according to claim 1, wherein the coil is an air-core coil defined by a copper-based wound wire member.

7. The surface mount coil component according to claim 6, wherein an insulating coating is provided on a surface of the wire member.

8. A DC-DC converter comprising:
a switching element; and
a choke coil connected to the switching element; wherein
the choke coil includes:
an element body defining a compact including magnetic material particles;
a coil that is buried, excluding an end portion of the coil, in the element body; and
an input-output terminal electrically connected to the end portion of the coil;
a thermoplastic resin layer is provided on a surface on a mounting surface side of the element body;
an interlayer connection conductor is provided in the thermoplastic resin layer;
the input-output terminal is provided on a surface of the thermoplastic resin layer and is electrically connected to the end portion of the coil via the interlayer connection conductor;
the end portion of the coil projects from the surface of the element body and is positioned inside the interlayer connection conductor; and
a width of a wire defining the end portion of the coil is smaller than a width of the interlayer connection conductor.

9. The DC-DC converter according to claim 8, wherein the magnetic material particles are magnetic metal powder, and the element body is a pressurized powder compact including the magnetic metal powder.

10. The DC-DC converter according to claim 8, wherein a plating film is provided on a surface of the input-output terminal.

11. The DC-DC converter according to claim 8, wherein an intermetallic compound is included in a bonding portion between the interlayer connection conductor and the end portion of the coil.

12. The DC-DC converter according to claim 8, wherein a thermoplastic resin layer is provided on a rear surface of the element body.

13. The DC-DC converter according to claim 8, wherein the coil is an air-core coil defined by a copper-based wound wire member.

14. The DC-DC converter according to claim 13, wherein an insulating coating is provided on a surface of the wire member.

* * * * *